(12) United States Patent
Takeishi (10) Patent No.: US 6,573,976 B2
(45) Date of Patent: Jun. 3, 2003

(54) EXPOSURE APPARATUS, EXPOSURE METHOD, AND SEMICONDUCTOR DEVICE MANUFACTURING METHOD

(75) Inventor: Hiroaki Takeishi, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/942,667

(22) Filed: Aug. 31, 2001

(65) Prior Publication Data

US 2002/0039178 A1 Apr. 4, 2002

(30) Foreign Application Priority Data

Oct. 4, 2000 (JP) .................................... 2000-305411

(51) Int. Cl.[7] .............................................. G03B 27/52
(52) U.S. Cl. ......................................... 355/55; 355/52
(58) Field of Search ............................ 355/53, 55, 52, 355/72

(56) References Cited

U.S. PATENT DOCUMENTS

| | | | | |
|---|---|---|---|---|
| 5,699,146 A | * | 12/1997 | Kaminaga | ................... 355/53 |
| 5,757,149 A | | 5/1998 | Sato et al. | ................... 318/135 |
| 5,936,710 A | * | 8/1999 | Itoh et al. | ..................... 355/53 |
| 6,081,614 A | * | 6/2000 | Yamada et al. | ............. 382/141 |
| 6,256,085 B1 | | 7/2001 | Takeishi | ..................... 355/53 |

FOREIGN PATENT DOCUMENTS

JP        9-45608        2/1997

* cited by examiner

Primary Examiner—D. Ben Esplin
(74) Attorney, Agent, or Firm—Fitzpatrick, Cella, Harper & Scinto (57) ABSTRACT

A scan exposure apparatus includes a mask stage on which a mask is to be placed, a substrate stage on which a substrate is to be placed, and a detection unit for detecting a surface shape of the substrate in each of a plurality of areas thereof. The surface shape is taken into consideration to drive the substrate stage in an exposure process. The apparatus further includes a controller for deciding scanning speeds of the mask stage and the substrate stage for each of a plurality of the areas based on the result of detection by the detection unit so as not to exceed a predetermined value of a synchronization error between the mask stage and the substrate stage.

19 Claims, 10 Drawing Sheets

SEMICONDUCTOR DEVICE MANUFACTURING FLOW

EXPOSURE APPARATUS, EXPOSURE METHOD, AND SEMICONDUCTOR DEVICE MANUFACTURING METHOD

FIELD OF THE INVENTION

The present invention relates to an exposure apparatus, an exposure method, and a semiconductor device manufacturing method.

BACKGROUND OF THE INVENTION

The mainstream of conventional exposure apparatuses has been step-and-repeat exposure apparatuses (so-called steppers) in which a wafer stage is positioned on a plane, then exposure processes are repeated for the wafer on the stage. In recent years, however, as semiconductor circuits are refined in structure more and more, there have appeared so-called scanning exposure apparatuses, in each of which a circuit pattern drawn reticle (mask) and a wafer (substrate) are put on their stages, so that they are scanned synchronously and exposed to light. Such scanning exposure apparatuses are now employed positively for mass production processes of wafers. One of the reasons why the stepper is replaced with such a scanning exposure apparatus is that the scanning exposure apparatus can assume a larger exposure field than the stepper. Another reason for the replacement is characteristics specific to the scanning exposure including the easiness to make uniform the contrast in light exposure.

Figure 10:
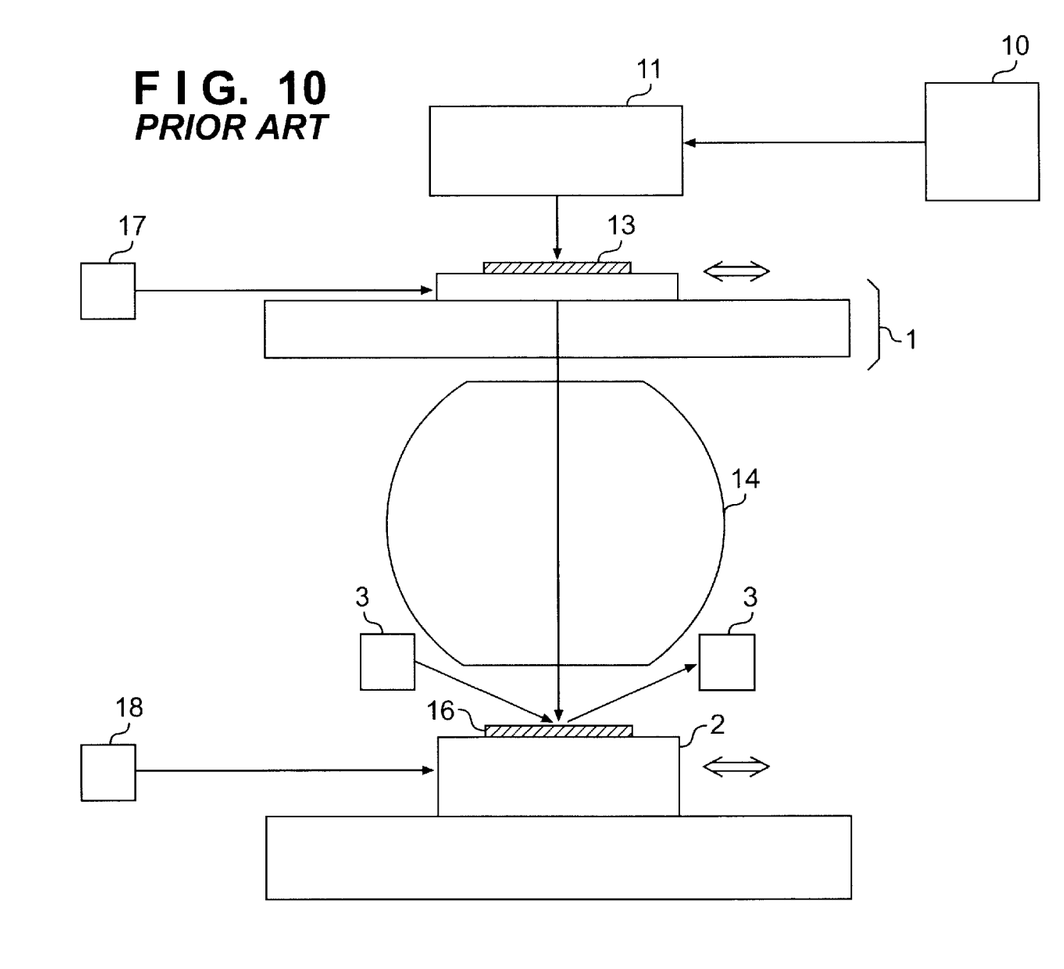
FIG. 10 is a schematic block diagram of the main configuration of a conventional scanning exposure apparatus.

FIG. 10 shows a schematic block diagram of a scanning exposure apparatus. A KrF excimer laser is often used as a light source 10. The beam from the light source 10 is formed in a lighting optical system 11, then irradiated on a substrate (reticle) 13 held on a reticle stage (mask stage) 1 through a slit of about a few millimeters. The beam passing through a projection optical system 14 then reaches to a wafer 16 held on a wafer stage (substrate stage) 2. At this time, the wafer stage 2 and the reticle stage 1 are moved together at a constant speed in the opposite direction, thereby an exposure field wider than the slit is obtained. The reason why those stages 2 and 1 are moved together in the opposite directions is to turn over the subject focused image in the projection optical system 14.

The positions of the reticle stage 1 and the wafer stage 2 in the translation direction are measured precisely with the use of laser measuring machines 17 and 18. The positions of those stages 1 and 2 in the vertical direction are measured as follows; at first, a focusing detection system 3 detects a relative distance between the wafer surface and the exposure imaging surface, and then the wafer stage 2 is driven so as to align the wafer surface to the exposure imaging surface according to the obtained focusing measurement value. The surface of the wafer 15 must be aligned to the exposure imaging surface in the area where the light is irradiated through the slit. Consequently, the wafer stage 2 must be driven in the Z direction (focusing) and the tilting direction (leveling), respectively. This is one of the characteristics of the scanning exposure apparatus, thereby providing an advantage that the above stages 1 and 2 are driven precisely for adjustment of both focusing and leveling on the subject chip.

It is well known that the exposure performance of the scanning exposure apparatus is much affected by a relative position error, that is, a synchronization error in the horizontal direction between the reticle stage 1 and the wafer stage 2 that are synchronously scanned. In addition, the moving average of the synchronization error in the slit corresponds to a deviation of an image to be exposed, that is, a distortion and the moving standard deviation corresponds to an image contrast. Consequently, how to minimize this synchronization error is one of the major technical problems that must be solved for semiconductor manufacturing processes that are getting refined more and more.

On the other hand, driving of the above two stages 1 and 2 for adjustment of both focusing and leveling during scanning exposure is indispensable for the scanning exposure apparatus as described above. However, such driving often causes the synchronization error to become worse. Especially, because the wafer stage 15 is driven for both leveling and driving, the driving is apt to affect the synchronization error as other components, for example, the driving in the $\omega x$ direction affects the y direction or the driving in the $\omega y$ direction affects the x direction. It is needless to say that in order to avoid such a problem, therefore, a control compensator is designed so as to reduce such an influence on other components with the use of various controlling techniques. In addition, an actual driving distance for adjustment of both focusing and leveling depends significantly on the surface accuracy of the subject wafer to be exposed to light and the flatness of the wafer chuck used to absorb and hold the wafer. It is difficult to solve the problem only with the controlling method.

Especially, it is very difficult to manage the flatness of each wafer so as to suppress the synchronization error to be equal to or under a fixed value even with the use of the same exposure apparatus, since the flatness differs among semiconductor manufacturing processes or production lots.

The productivity of the scanning exposure apparatus can be increased in proportion to an increase of the scanning speed. As a result, a track of stage driving for adjustment of leveling just on a single chip comes to have a high frequency. Generally, the higher the frequency becomes, the lower the follow-up performance becomes in an actuator control system employed for stages. At the same time, the influence of such stage driving on other components becomes large unavoidably. When the scanning speed is increased, therefore, the synchronization accuracy is degraded even when the flatness is the same among wafers.

As described above, the scanning speed affects the synchronization error and this synchronization error affects the exposure performance significantly. However, because the scanning speed is usually set according to such factors as resist sensitivity, exposure amount, etc., the synchronization error has become subordinate in the performance to be decided by other items. Such a method for deciding a scanning speed requires a lot of time for deciding semiconductor manufacturing process conditions and causes the manufacturing yield to drop due to a difference among wafer surface accuracy values.

SUMMARY OF THE INVENTION

Under such circumstances, it is an object of the present invention to provide an exposure apparatus, an exposure method, and a semiconductor device manufacturing method enabled to decide an optimal scanning speed according to such manufacturing process conditions as flatness of a substrate, etc., thereby exposing subject wafers to light at a high yield while both exposure performance and productivity are kept at a high level, respectively.

It is another object of the present invention to provide an exposure apparatus, an exposure method, and a semiconductor device manufacturing method that can prevent the processing capability, that is, the throughput of the exposure apparatus from going low, to improve both imaging performance and productivity, and to realize a high yield by deciding an optimal scanning speed for each of a plurality of areas on the subject substrate.

It is another object of the present invention to provide a scan exposure apparatus comprising: a mask stage on which a mask is to be placed; a substrate stage on which a substrate is to be placed; a detection unit for detecting a surface shape of the substrate in each of a plurality of areas thereof, the surface shape being taken into consideration to drive the substrate stage in an exposure process; and a controller for deciding scanning speeds of the mask stage and the substrate stage for each of a plurality of the areas based on the result of a detection by the detection unit so as not to exceed a predetermined value of a synchronization error between the mask stage and the substrate stage.

It is still another object of the present invention to provide the exposure apparatus, wherein the controller includes a track creating device for creating a driving track of the substrate stage, which is used to drive the substrate stage in the exposure process, based on the result of a detection by the detection unit; and an estimating device for estimating a synchronization error between the mask stage and the substrate stage when the substrate is driven along the driving track created by the track creating device; and the controller decides scanning speeds of the mask stage and the substrate stage for each of a plurality of the areas so as not to exceed the predetermined value of the synchronization error estimated by the estimating device.

It is still another object of the present invention to provide the exposure apparatus, wherein the detection unit detects a position of the surface of the substrate in the vertical direction in each of a plurality of the areas.

It is still another object of the present invention to provide the exposure apparatus, wherein the detection unit detects a distance between the surface of the substrate and the focusing surface of a projection optical system for projecting a pattern of the reticle in each of a plurality of the areas.

It is still another object of the present invention to provide the exposure apparatus, wherein each of a plurality of the areas respectively corresponds to one of a plurality of shot areas on the substrate and the controller decides scanning speeds of the mask stage and the substrate stage for each of the areas.

It is still another object of the present invention to provide the exposure apparatus, which further includes a measuring instrument for measuring a synchronization error between the substrate stage and the mask stage when the exposure process is executed; and the controller includes a changing device for changing the scanning speeds of the mask stage and the substrate stage decided for each of a plurality of the areas based on the result of measurement by the measuring instrument.

It is still another object of the present invention to provide the exposure apparatus, wherein the detection unit detects a surface shape of each area on the substrate while both of the mask stage and the substrate stage are driven for scanning.

It is still another object of the present invention to provide the exposure apparatus, wherein a detection by the detection unit is done before an actual exposure operation.

It is still another object of the present invention to provide a controlling method for controlling an exposure apparatus provided with a mask stage on which a mask is to be placed and a substrate stage on which a substrate is to be placed and enabled to expose the substrate to light with use of a pattern of the mask while both of the mask stage and the substrate are synchronously scanned, the method comprising: a detecting process of detecting a surface shape in each of a plurality of areas on the substrate, the surface shape being taken into consideration to drive the substrate stage in an exposure process; and a scanning speed deciding process of deciding scanning speeds of the mask stage and the substrate stage for each of a plurality of the areas based on the result of a detection by the detecting process so as not to exceed a predetermined value of synchronization error between the mask stage and the substrate stage.

It is still another object of the present invention to provide the controlling method, which further includes a track creating process of creating a driving track of the substrate stage, which is used to drive the substrate stage in the exposure process, based on the result of a detection by the detecting process; the scanning speed deciding process includes an estimating process of estimating a synchronization error between the mask stage and the substrate stage when the substrate stage is driven along the driving track created by the track creating process and decides scanning speeds of the mask stage and the substrate stage for each of a plurality of the areas so as not to exceed the predetermined value of the synchronization error estimated by the estimating process.

It is still another object of the present invention to provide the controlling method, wherein the detecting process detects a position of the surface of the substrate in the vertical direction in each of a plurality of the areas.

It is still another object of the present invention to provide the controlling method, wherein the detecting process detects a distance between the surface of the substrate in each of a plurality of the areas and the focusing surface of a projection optical system for projecting a pattern of the reticle.

It is still another object of the present invention to provide the controlling method, wherein each of a plurality of the areas respectively corresponds to one of a plurality of shot areas on the substrate respectively and the scanning speed deciding process decides scanning speeds of the mask stage and the substrate stage for each of a plurality of the shot areas.

It is still another object of the present invention to provide the controlling method, which further includes a measuring process of measuring a synchronization error between the mask stage and the substrate stage when the exposure process is executed; and the scanning speed deciding process includes a changing process of changing the scanning speeds of the mask stage and the substrate stage decided for each of a plurality of the areas based on the result of a measurement by the measuring process.

It is still another object of the present invention to provide the controlling method, wherein the detecting process detects a surface shape of each of a plurality of the areas on the substrate while both of the mask stage and the substrate stage are driven for scanning.

It is still another object of the present invention to provide the controlling method, wherein the detecting process is done before an actual exposure operation.

It is still another object of the present invention to provide a controlling program for controlling an exposure apparatus provided with a mask stage on which a mask is to be placed and a substrate stage on which a substrate is to be placed and enabled to expose the substrate to light with the use of a pattern of the mask while both of the mask stage and the substrate stage are synchronously scanned, the program comprising: a detecting process of detecting a surface shape of each of a plurality of areas on the substrate, the surface shape being taken into consideration to drive the substrate stage in an exposure process; and a scanning speed deciding process of deciding scanning speeds of the mask stage and the substrate stage for each of a plurality of the areas based on the result of a detection by the detecting process so as not to exceed a predetermined value of a synchronization error between the mask stage and the substrate stage.

It is still another object of the present invention to provide an exposure method that uses an exposure method that uses an exposure apparatus provided with a mask stage on which a mask is to be placed and a substrate stage on which a substrate is to be placed and enabled to expose the substrate to light with the use of a pattern of the mask while both of the mask stage and the substrate stage are synchronously scanned, the method comprising: a detecting process of detecting a surface shape of each of a plurality of areas on the substrate; a scanning speed deciding process of deciding scanning speeds of the mask stage and the substrate stage for each of a plurality of the areas based on the result of a detection by the detecting process so as not to exceed a predetermined value of a synchronization error between the mask stage and the substrate stage; and an exposing process of exposing the substrate to light with the use of a pattern of the mask by controlling both of the mask stage and the substrate stage according to the scanning speed decided by the scanning speed deciding process.

It is still another object of the present invention to provide a manufacturing method for manufacturing semiconductor devices, comprising: a process of coating a sensitive material on a substrate; a process of exposing the sensitive material on the substrate to light with the use of the exposure method according to claim 18; and a process of developing the sensitive material after the exposure.

According to the exposure apparatus of the present invention, a scanning speed is decided according to the surface shape of the subject substrate so as not to exceed a predetermined value of a synchronization error (relative positional deviation) between the mask stage and the substrate stage. Consequently, for example, an optimal scanning speed can be selected according to the surface shape of the substrate, which might affect the synchronization error, thereby the maximum productivity is assured while the exposure performance is kept at a high level.

Furthermore, according to the exposure apparatus of the present invention, the scanning speed is decided for each of a plurality of areas on the subject substrate, thereby an optimal scanning speed can be set for each of those areas and the maximum throughput can be obtained corresponding to the predetermined synchronization accuracy and set conditions.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Hereunder, the preferred embodiments of the present invention will be described in detail with reference to the accompanying drawings.

First Embodiment

Figure 1:
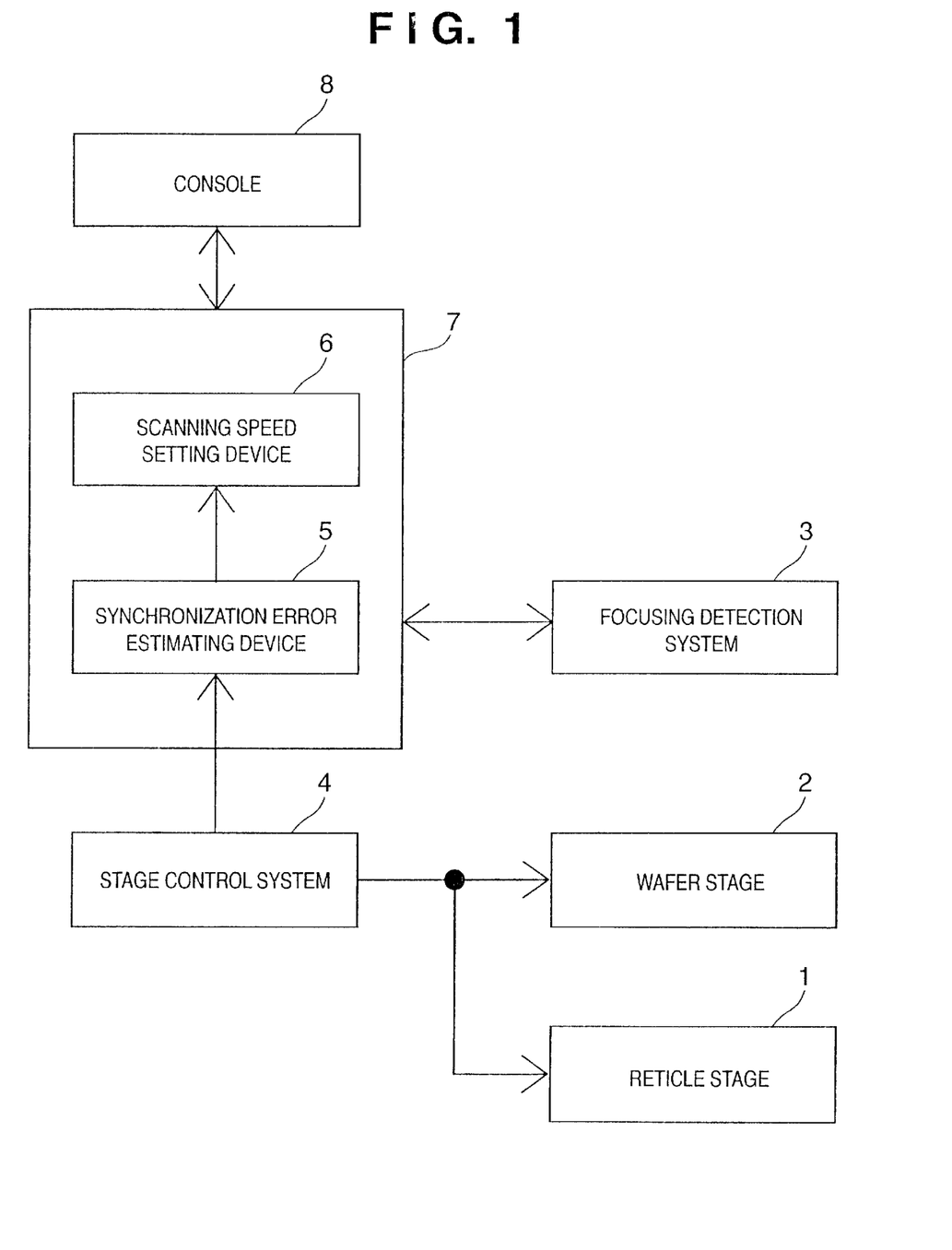
FIG. 1 is a schematic block diagram of a scanning exposure apparatus in the first embodiment.

FIG. 1 is a schematic block diagram of a control system for a scanning exposure apparatus in the first embodiment of the present invention. FIG. 10 is a diagram showing the basic configuration of the scanning exposure apparatus in another view.

In FIG. 1, reference numeral 1 denotes a reticle stage, which is the second driving mechanism. Reference numeral 2 denotes a wafer stage, which is the first driving mechanism. Both reticle (the reticle 13 shown in FIG. 10) and wafer (the wafer 16 shown in FIG. 10) are synchronized for scanning operations. Reference numeral 3 denotes a focusing detection system, which measures a relative distance between the surface of a subject wafer and a focusing surface at each of a plurality of points in each shot. Reference numeral 4 denotes a stage control system for controlling both of the reticle stage 1 and the wafer stage 2. A synchronization controller is included in the control system. Reference numeral 5 denotes a synchronization error estimating device 5 and the scanning speed setting device 6 sets a scanning speed and other exposure conditions and a console 8 functions as a user interface with the operator.

Hereinafter, the exposure method in the scan exposure apparatus of the embodiment, which includes scanning speed decision processing, will be described according to the flowchart shown in FIG. 2. The exposure method is employed for the scanning exposure apparatus in this embodiment. The controller 7 controls the processings executed in accordance with the flowchart shown in FIG. 2.

In steps S1 to S5, the exposure apparatus scans each shot on a wafer while the focusing detection system 3 makes a focusing measurement (measurement of a relative distance between the surface of a wafer on the wafer stage 2 and the imaging surface of the projection optical system 14, which projects a reticle pattern) at each of a plurality of points in each shot. In this embodiment, the focusing system is not driven for adjusting the focusing; only the focusing measurement is done. At this time, while the focusing system is not driven, a synchronization error is present between the wafer stage 2 and the reticle stage 1. This synchronization error is regarded as being caused by degradation of the synchronization accuracy from the so-called dark vibration level (a constant vibration level in the servo-locked state). This is why the synchronization accuracy to be affected by the synchronization error at this time, as well as the moving average and the moving standard deviation of the synchronization error, are calculated in advance.

Next, the processings in steps S1 to S5 will be described concretely. At first, the wafer stage 2 is driven so as to move the subject shot on the wafer to an exposure position in step S1. Then, the wafer stage 2 and the reticle stage 1 are synchronized so as to start scanning in step S2 and the focusing detection system 3 makes focusing measurement at each of a plurality of points in the subject shot in step S3. The synchronized scanning for the shot is ended in step S4. In step S5, it is decided whether or not the processings in steps S1 to S4 are completed for all the shots. When the decision is NO (when there is still a non-processed shot), control goes back to step S1 so as to repeat the processings in steps S1 to S4. When the decision is YES (when the processing for all the shots is completed), control goes to step S6.

In steps S6 to S8, the wafer surface shape is determined according to the focusing measurement value obtained in step S3 so as to create a driving track of a stage (typically, the driving track of the wafer stage 2) used to adjust both focusing and leveling. At this time, the wafer surface shape can also be determined accurately by removing the differences in level from the already-exposed resist with the use of the method disclosed in the official gazette of Japanese Patent Laid-Open No. 09-045608.

Concretely, in step S6, the wafer surface shape in the subject shot is calculated according to the focusing measurement value at each of a plurality of points in the shot obtained in steps S1 to S5. And, in step S7, a focusing/level track (stage driving track) is created from the wafer surface shape in the shot obtained in step S6. The created track is used for the shot exposure with respect to this surface shape. In step S8, it is decided whether or not the processings in steps S6 and S7 are completed for all the shots. When the decision is NO (when there is still a non-processed shot), control goes back to step S6 so as to repeat the processings in steps S6 and S7. When the decision is YES (when the processing for all the shots is completed), control goes to step S9.

In steps S9 to S11 and S13, a relative positional error (that is, a synchronization error) between the reticle stage 1 and the wafer stage 2 is estimated for each of a plurality of typical scanning speeds. The error appears when the stage driving track created in step S7 is used. Then, the synchronization error estimating device 5 estimates values of the moving average and the moving standard deviation of the synchronization error.

Concretely, in step S9, the synchronization error estimating device 5 estimates a relative positional error (that is, a synchronization error) between the reticle stage 1 and the wafer stage 2 to appear when the stage driving track created in step S7 is used. Then, the synchronization error estimating device 5 estimates values of the moving average and the moving standard deviation of the synchronization error in step S10. In step S11, it is decided whether or not the processings in steps S9 to S10 are completed for all of the typical scanning speeds. When the decision is NO (when there is still a non-processed scanning speed), control goes to step S13 so as to change the scanning speed to the unprocessed scanning speed. Control then goes back to step S9. When the decision is YES (when step S9 and step S10 are completed for all of a plurality of typical scan speeds), control goes to step S12.

In step S12, the scanning speed setting device 6 decides the maximum scanning speed for each shot according to the result of the calculation in step S9 so as not to exceed the synchronization error threshold set beforehand according to the subject process. Then, the device 6 creates a scanning speed setting table that describes the scanning speed for the reticle stage 1 and the wafer stage 2 to be set for each shot. In this case, the user supplies the synchronization error threshold in accordance with the subject process using the console 8.

In step S14, the pattern of the reticle placed on the reticle stage 1 is transferred to the wafer placed on the wafer stage 2 at a scanning speed set in the scanning speed setting table created in step S12. In this copying (exposure), the stage control system 4 controls the reticle stage 1 and the wafer stage 2 so as to move them at the scanning speed setting table. The console 8 displays the scanning speed for each shot set for each scanning exposure.

Figure 2:
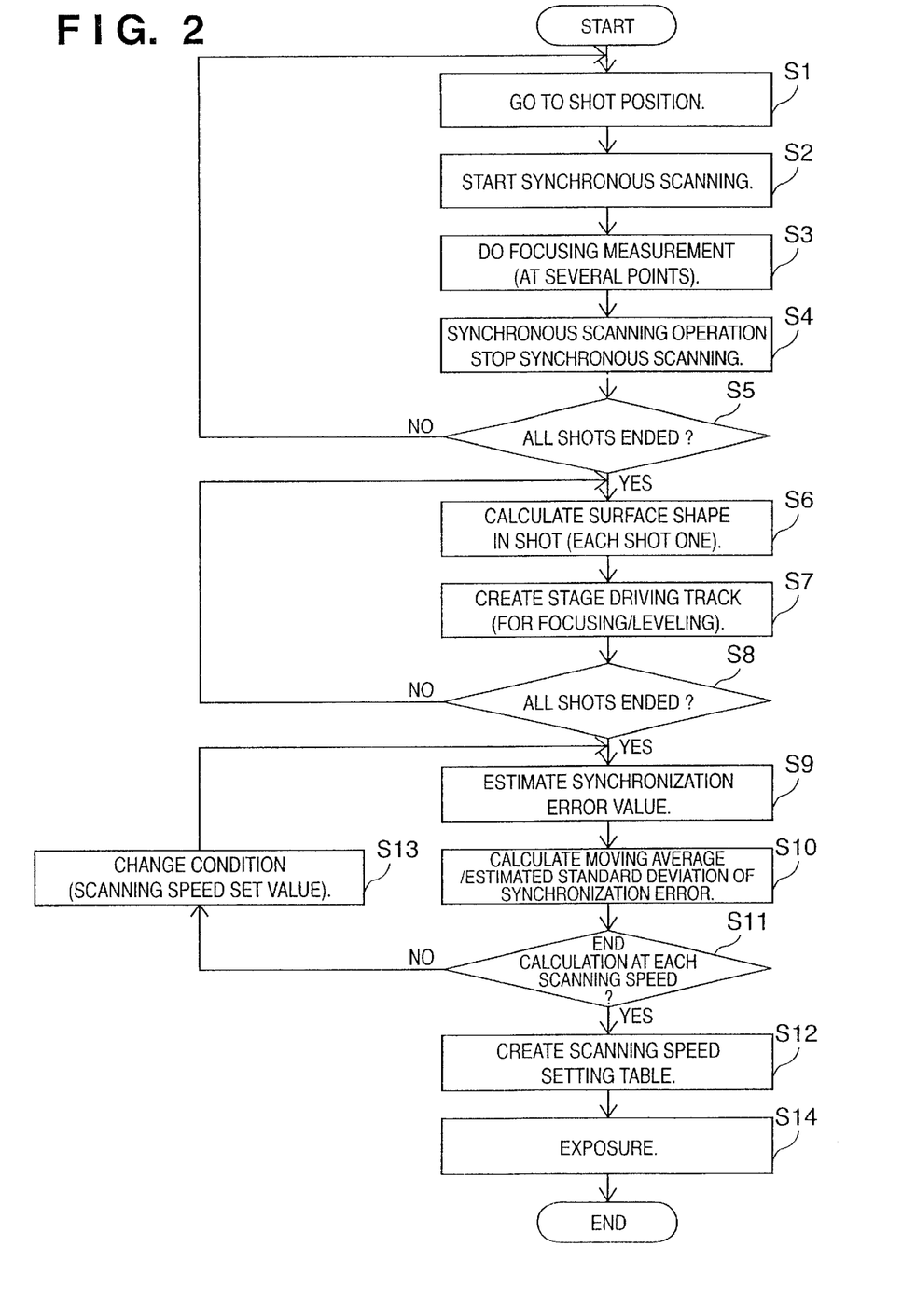
FIG. 2 is a flowchart showing the functions of the scanning exposure apparatus in the first embodiment and a scanning exposure method.

The decision processings (S1 to S12) for the scanning speed shown in FIG. 2 may be done, for example, for each wafer or once for a plurality of wafers or for each lot.

Figure 3:
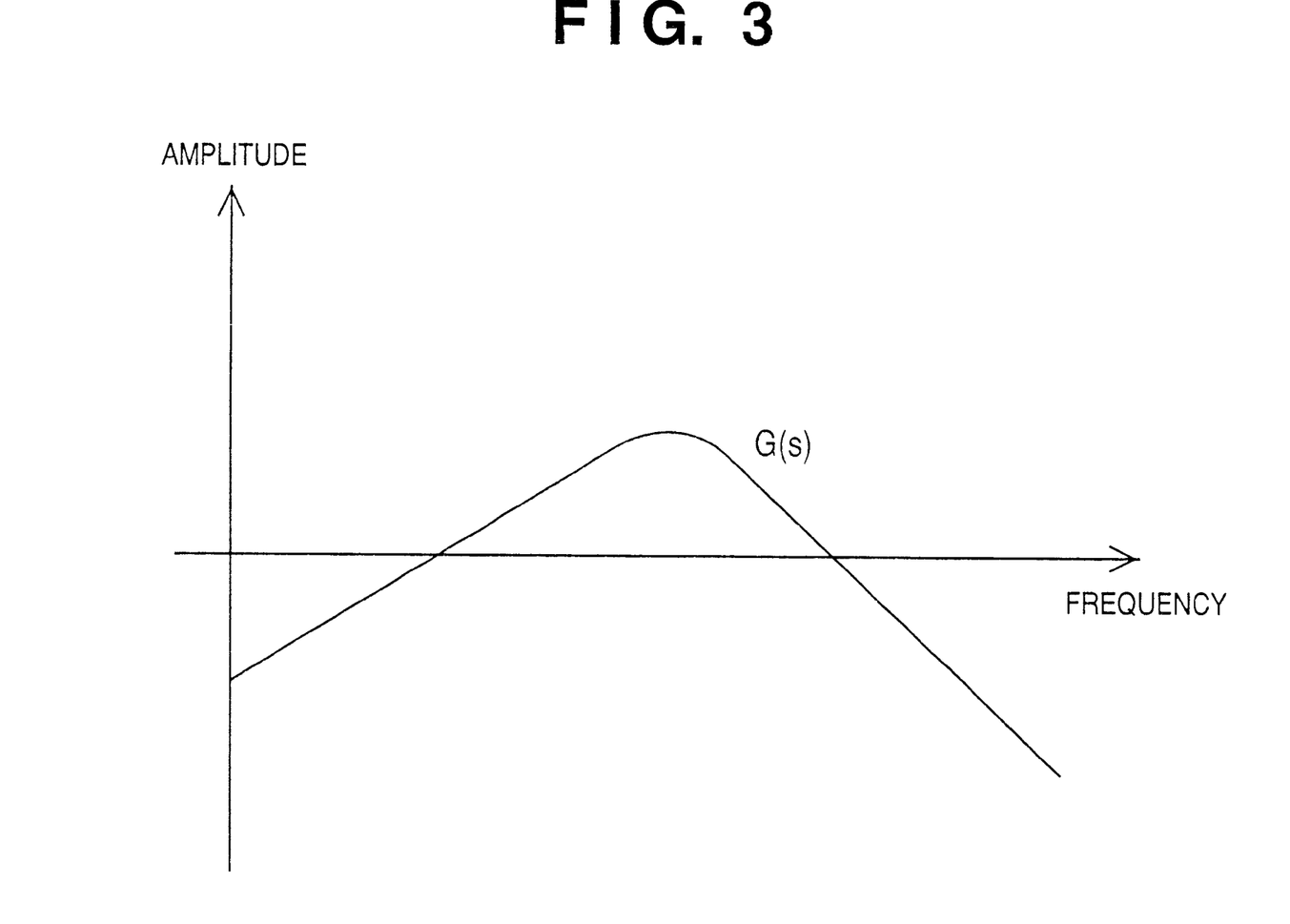
FIG. 3 is a characteristic chart for denoting a frequency characteristic G(s)

Next, the processings in steps S9 to S11 will be described in more detail. Generally, an influence of stage driving on another component, for example, an influence of a stage driven for tilting (driving or leveling) on the translation direction, can be represented as a transmission characteristic, that is, a frequency characteristic $G(s)$ assumed between an excitation input in the tilting direction and a control deviation in the forward direction. This characteristic usually denotes a low range differentiation/high range integration characteristic as shown in FIG. 3. The frequency characteristic is specific to the stage unit and it can be determined accurately by an FFT analyzer or through frequency analysis/calculation similar to that. Consequently, it is possible to calculate an output, that is, a translation control deviation, in response to a stage driving track (focusing level track) created for a system 100 having such a characteristic $G(s)$ in step S7 in accordance with the block line diagram shown in FIG. 4. The focusing/leveling track is decided by a wafer surface shape and the shape is identical among scanning speeds. Therefore, wafer surface shapes are always similar to each other; only the time axis of each surface shape changes in proportion to the scanning speed. It is thus possible to find the control deviation at each scanning speed by repeating one and the same procedure.

Figure 4:
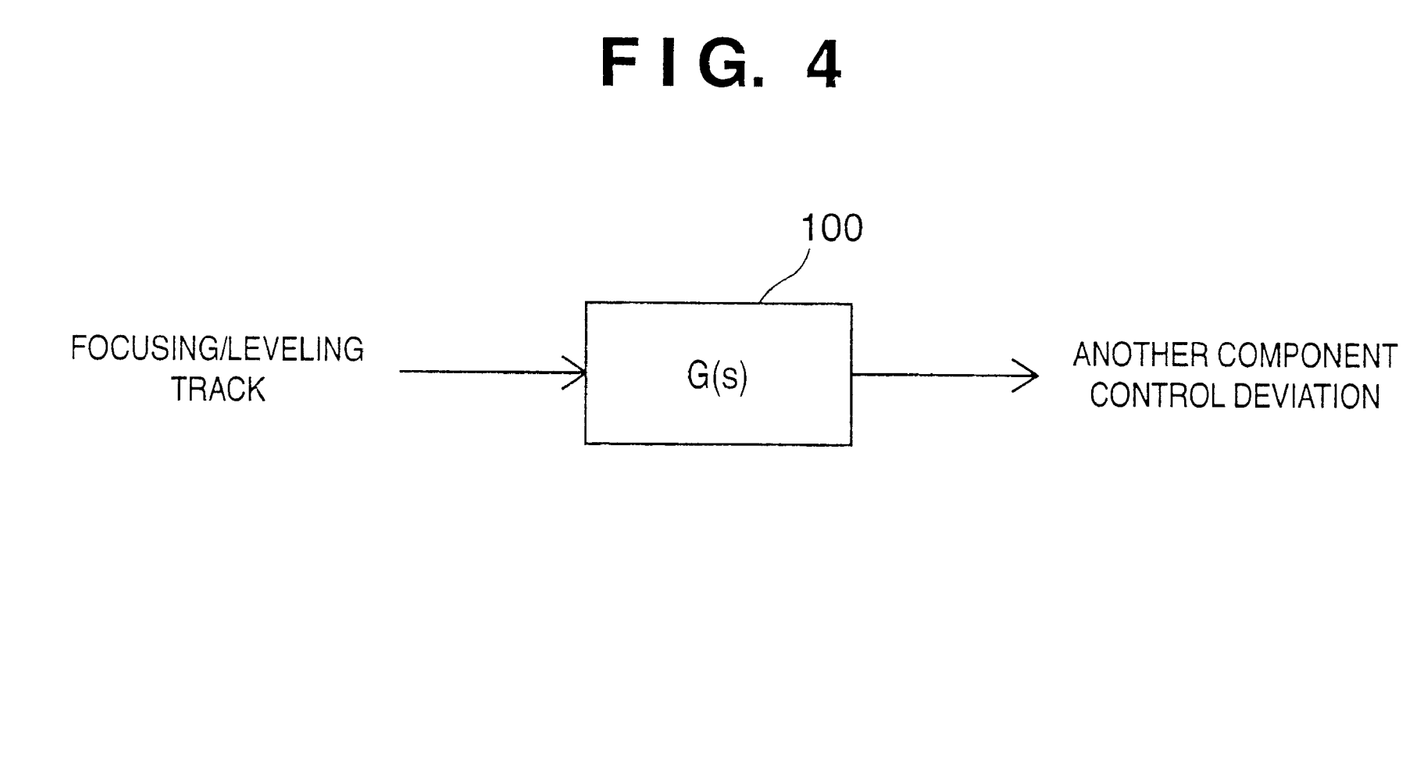
FIG. 4 is a line block diagram for denoting an order for calculating a translation direction control deviation.

While a description has been made for an influence of stage driving for tilting (stage driving for leveling) on the forward direction, it is needless to say that the same procedure can also be used for an influence of stage driving for focusing, of course.

In a case where an estimated value is obtained for a control deviation when a stage is driven for adjustment of focusing/leveling along the driving track for focusing/leveling obtained in steps S1 to S5, it is possible to find a synchronization error estimated value at a real exposure time just by adding the estimated value to the synchronization error obtained in steps S1 to S5 as a degradation value while the stage is not driven for adjustment of focusing/leveling.

Concretely, the estimated value of the synchronization error at a real exposure time becomes a value obtained by adding up the synchronization error (found in steps S1 to S5) when the stage is not driven for focusing/leveling and the synchronization error predicted from synchronous error due to focusing leveling drive (estimated from the shape of a difference in level in a shot and the transmission characteristic).

It is thus enabled to estimate the synchronization error accurately for each scanning speed. And, in step S12, because the maximum scanning speed that satisfies the set synchronization accuracy can be set for each shot, the maximum throughput can be obtained corresponding to the conditions such as a given process condition, etc.

Figure 5:
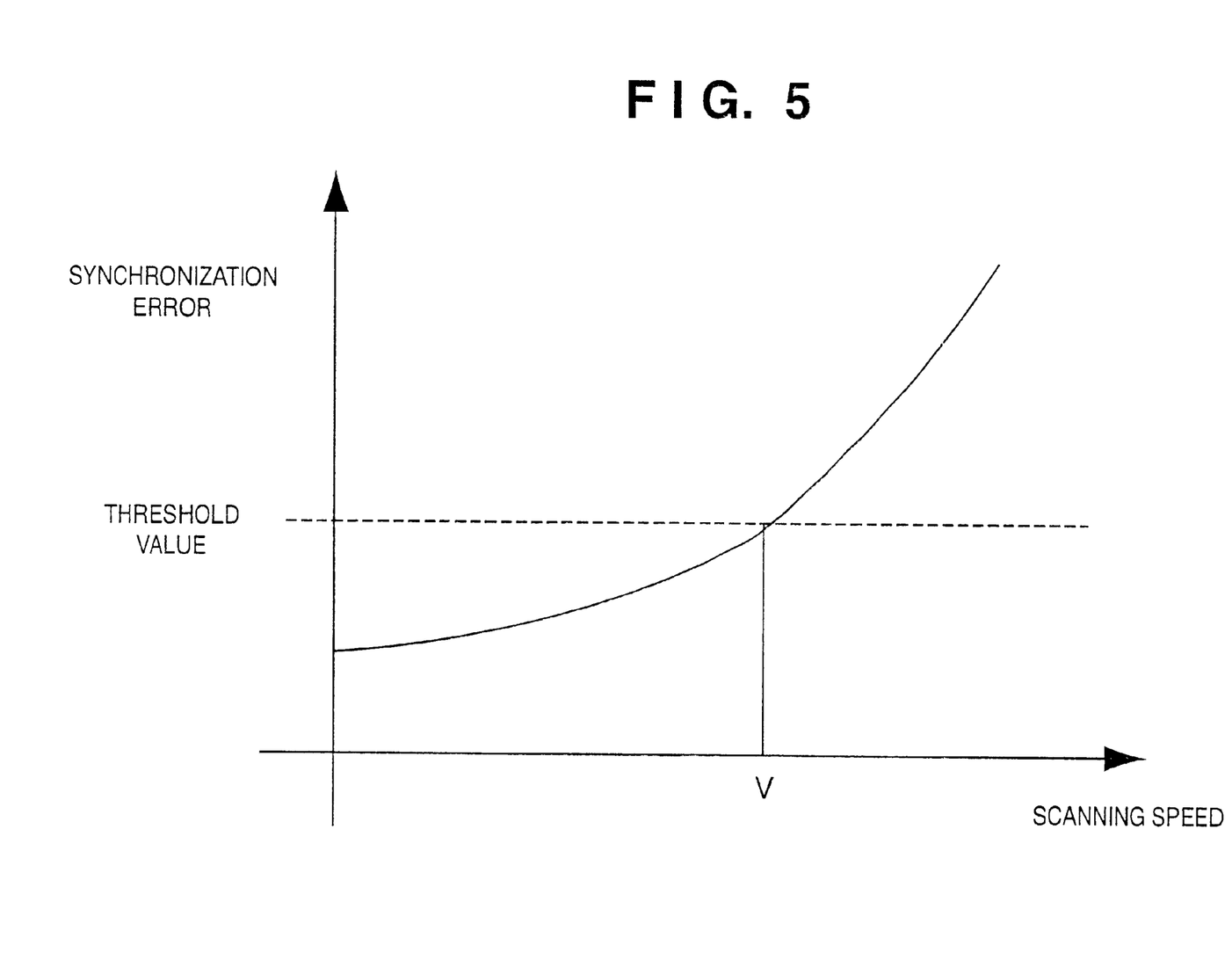
FIG. 5 is a characteristic diagram for denoting a relationship between a scanning speed and a synchronization error.

FIG. 5 shows how such a maximum throughput is obtained. As shown in FIG. 5, the synchronization error obtained for a scanning speed is apt to increase monotonically. When a synchronization accuracy threshold required for a semiconductor manufacturing process is set, therefore, the maximum scanning speed V that satisfies the threshold can be selected.

According to the scanning exposure apparatus in the first embodiments as described above, therefore, an optimal scanning speed can be set as one of such manufacturing conditions as wafer flatness, etc., thereby both exposure performance and productivity can be set at a high level, respectively, so as to assure high yield exposure.

Furthermore, according to this embodiment described above, because an optimal scanning speed is set for each area (typically, for each shot area) on the subject wafer, the exposure apparatus processing capability, that is, the throughput can be prevented from degradation, thereby both imaging performance and productivity can be improved so as to assure high yield exposure.

Next, a description will be made of a semiconductor device manufacturing method employed for the projection exposure apparatus described with reference to FIG. 2.

Figure 6:
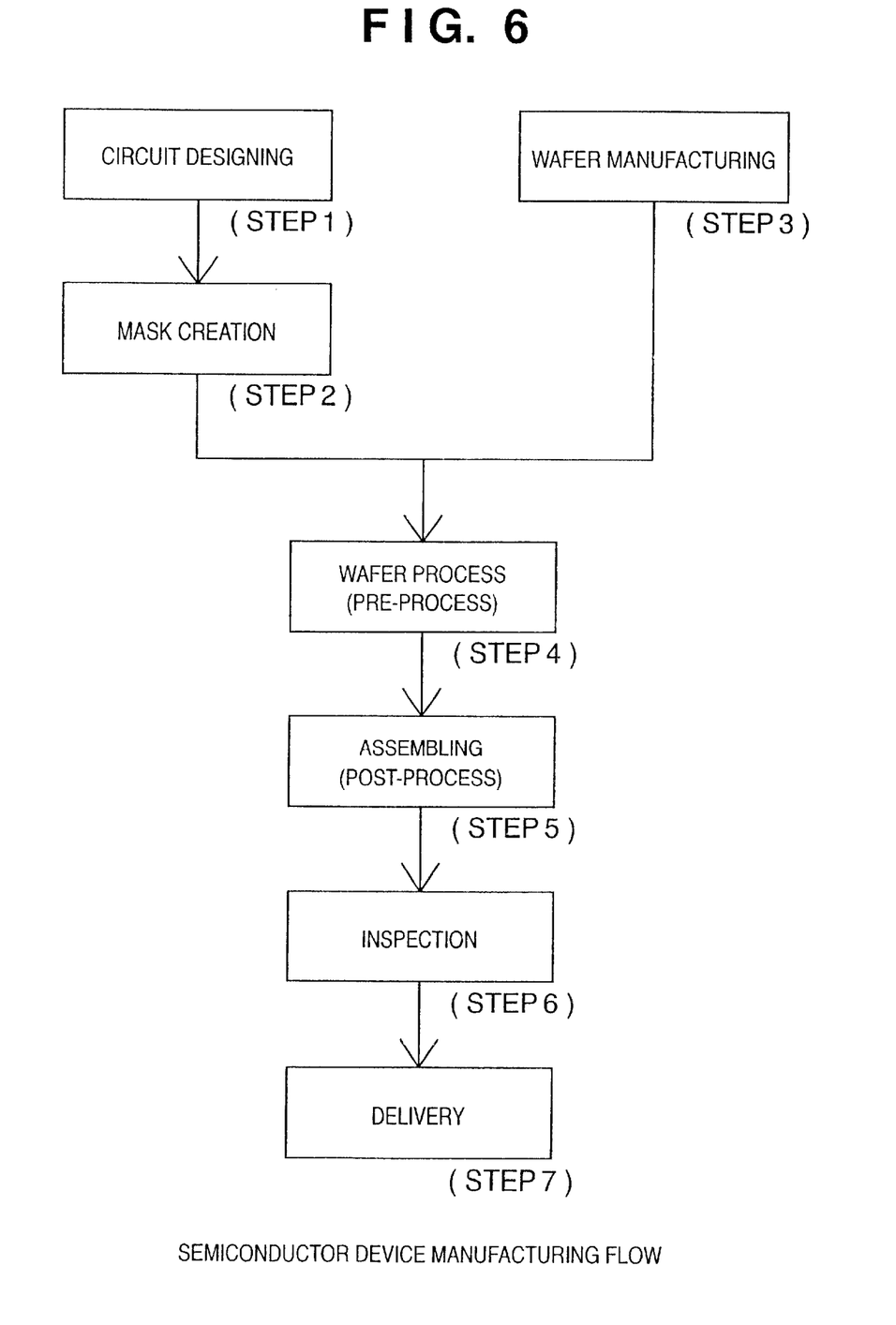
FIG. 6 is a flowchart for executing semiconductor device manufacturing processes for which the scanning exposure apparatus of the present invention is employed.

FIG. 6 shows a flowchart of the process of manufacturing a semiconductor device (such a semiconductor chip as an IC, an LSI, etc., or a liquid crystal panel, a CCD, etc.).

At first, the circuit of the semiconductor device is designed in step 1 (circuit designing). In step 2 (mask creation), a mask is created for the designed circuit pattern. On the other hand, a wafer is manufactured with the use of such materials as silicon, etc., in step 3 (wafer manufacturing). And, in step 4 (wafer process) referred to as a pre-process, an actual circuit is formed on the wafer by a photolithography technique with the use of the mask and the wafer prepared as described above. The next step, step 5 (assembling) is referred to as a post-process in which the wafer manufactured in step 4 is used to manufacture a semiconductor chip. The post-process includes an assembling process (dicing, bonding), a packaging process (chip sealing), etc. In step 6 (inspection), the operation of the semiconductor device manufactured in step 5 is verified, as well as other inspections such as a durability test, etc., are performed. The semiconductor device, completed through those processes, is then delivered (step 7).

Figure 7:
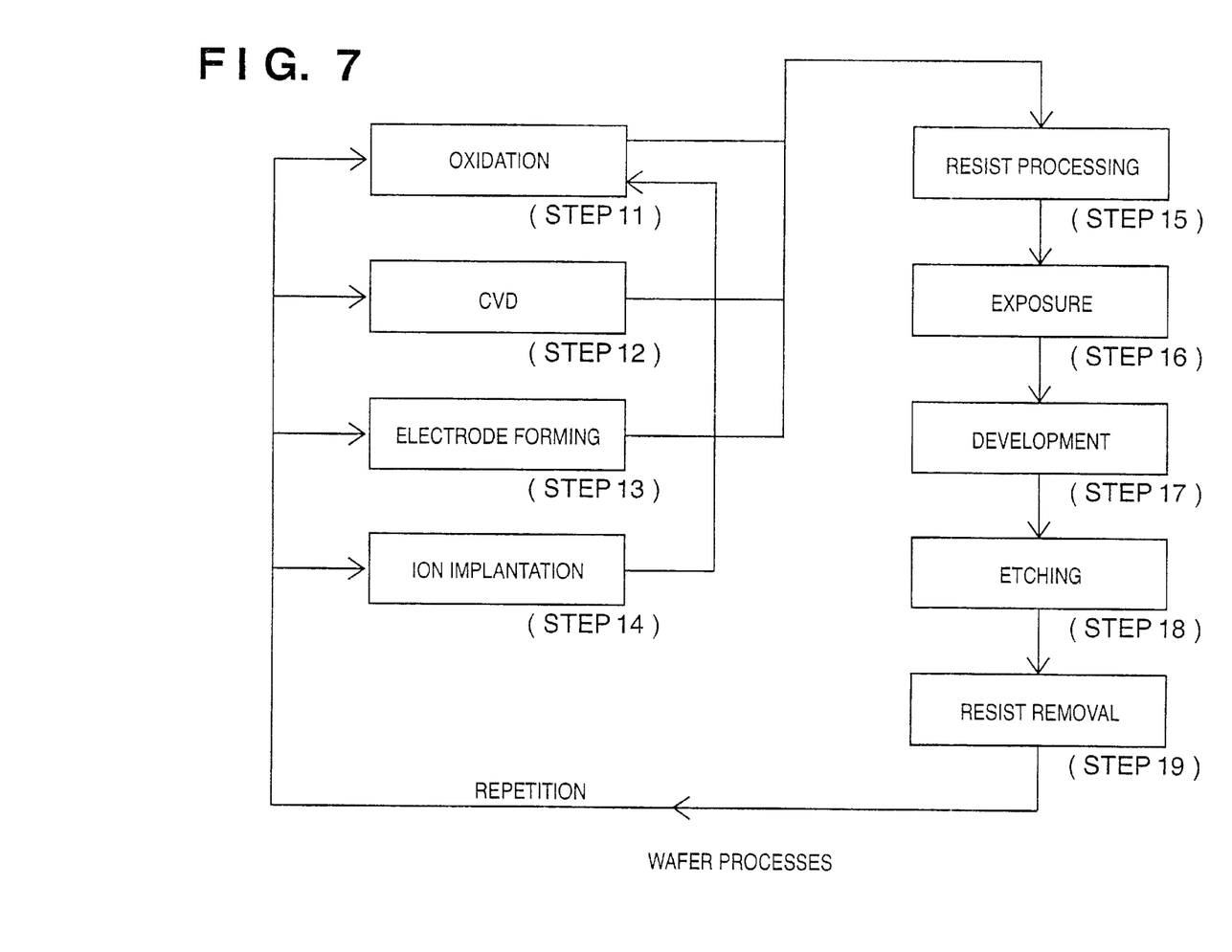
FIG. 7 is a flowchart for a detailed wafer process included in the processes shown in FIG. 6.

FIG. 7 shows a detailed flowchart of the wafer processes.

In step 11 (oxidation), the surface of the wafer is oxidized. Then, an insulating film is formed on the wafer surface in step 12 (CVD). Electrodes are then formed on the wafer by vaporization. In step 14 (ion implantation), ions are implanted in the wafer. In step 15 (resist processing), a sensitive agent is coated on the wafer. In step 16 (exposure), a masking circuit pattern is printed and exposed to light on the wafer with the use of the scanning exposure apparatus described above. In step 17 (development), the exposed wafer is developed. In step 18 (etching), the surface of the wafer except for the developed resist image is scraped off. In step 19 (resist removal), unnecessary resist is removed after the etching. By repeating the above processings, a multiplexed circuit pattern is formed on the wafer.

In cases where this manufacturing method is used, the advantage of the method, combined with various advantages of the scanning exposure apparatus, makes it possible to manufacture the above-described high integrated semiconductor device more easily and accurately at a high yield while the manufacturing has been difficult conventionally.

Second Embodiment

Next, the second embodiment of the present invention will be described. In this second embodiment, step S14 in the exposure method described in the first embodiment is replaced with step S14' and step S15 (not shown) for a learning function is added.

In step S13', scanning exposure is done for a wafer at a scanning speed set in the scanning speed setting table created in step S12. In this second embodiment, an actual synchronization error between the reticle stage 1 and the wafer stage 2 is measured and recorded for each shot at this exposure time with the use of laser measuring machines 17 and 18. The console 8 can display the scanning speed for each shot at this time.

The processing in step S14 is executed after the processing of a single wafer is completed in step S13' so that the estimated value of the synchronization error in step 9 is compared with the synchronization error to generate an actual exposure in step S13' before exposure for each shot. When the actual synchronization error is under the estimated value, the scanning speed is increased within a value not exceeding the difference between them. When the actual synchronization error is over the estimated value, the scanning speed setting table is rewritten for each shot so that the scanning speed is lowered according to the degradation value. After this, the next wafer processing is done.

Because the scanning exposure apparatus is provided with such a learning function, once a scanning speed is set for the first wafer of a lot, the scanning speed reaches the optimized value, step by step, while a plurality of wafers is processed.

It is also possible to let the learning function update the scanning speed automatically after a slow scanning speed is set as the initial value in the scanning speed setting table. After this, real exposure is started. The pre-processing (scanning speed decision) equivalent to the processings in steps S1 to S12 is omitted at this time.

According to the second embodiment, in addition the advantages of the first embodiment, it is also possible to obtain another advantage that the maximum productivity can be obtained very efficiently while the exposure performance is kept as is.

Third Embodiment

As described above, synchronization accuracy affects a relative position between two stages in the horizontal direction. This accuracy is focused in the first embodiment. And, the same concept can also apply to the vertical direction. It is well known that a control deviation to appear between two stages in the vertical direction when a stage is driven for focusing/leveling affects the contrast of an image to be exposed to light. This is because the allowance of such a control deviation is decided by the target line width, etc., in semiconductor manufacturing processes.

In order to achieve the above advantages, it is just required that a control deviation in the Z direction is determined from a focusing/leveling track just like the method for finding an estimated synchronization accuracy value from the transmission characteristic shown in FIG. 4 in the first embodiment, then a scanning speed that satisfies the threshold decided in the subject process is set. The details can be obtained easily from the first embodiment.

According to the scanning exposure apparatus in the third embodiment, therefore, it is possible to set an optimal scanning speed as one of such manufacturing process conditions as wafer flatness and to expose wafers to light at a high yield while both exposure performance and productivity are kept at a high level, respectively, just like in the first embodiment.

Furthermore, according to this third embodiment, because an optimal scanning speed is set for each of the areas on the subject wafer (typically, in each shot), it is possible to suppress the exposure apparatus processing capability, that is, throughput from going low, thereby improving both focusing performance and productivity and to realize high yield exposure.

Fourth Embodiment

Figure 8:
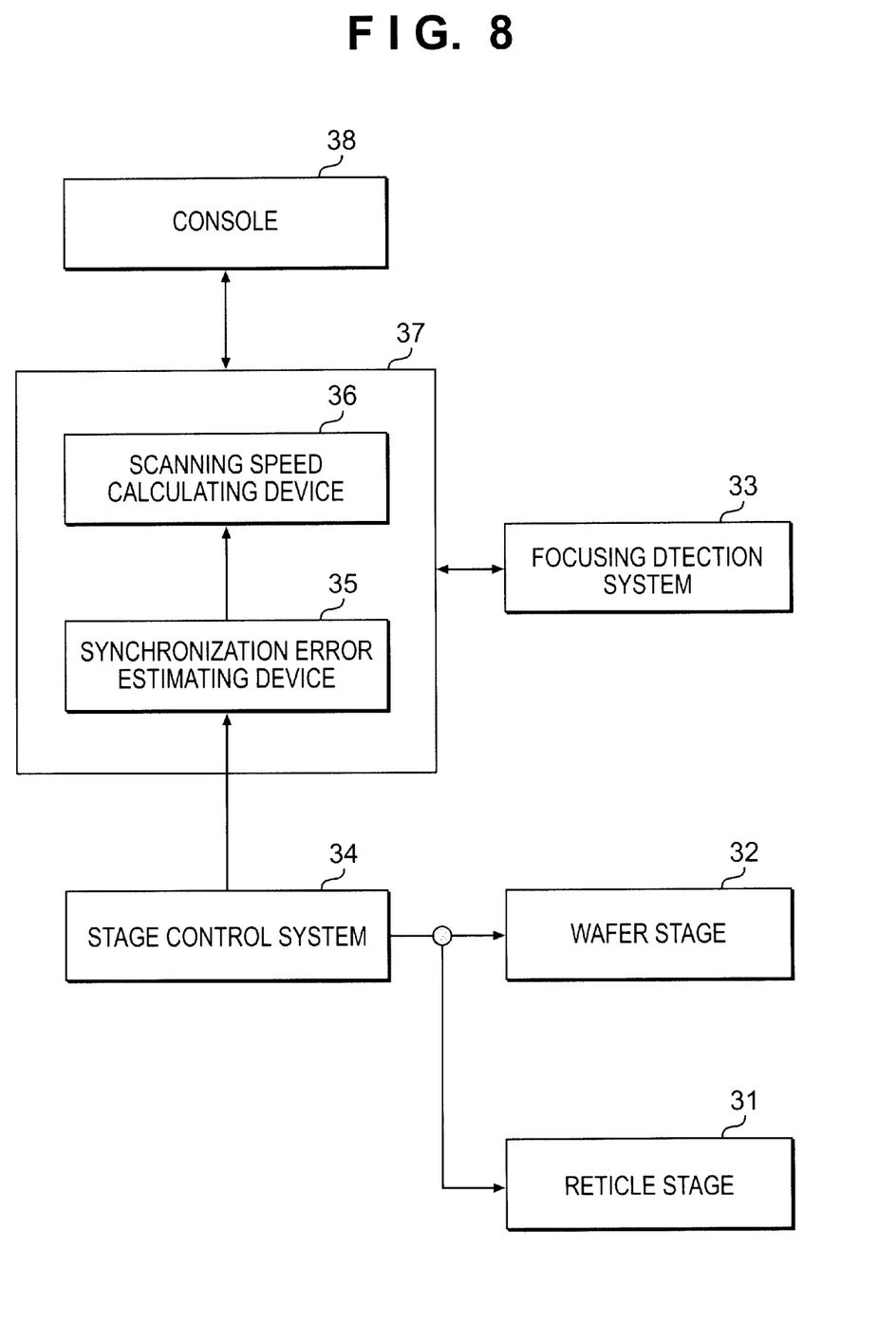
FIG. 8 is a schematic block diagram of a scanning exposure apparatus in the fourth embodiment.

FIG. 8, shows a schematic block diagram of a scanning exposure apparatus in the fourth embodiment of the present invention.

In FIG. 8, reference numeral 31 denotes a reticle stage, which is the second driving mechanism and reference numeral 32 denotes a wafer stage, which is the first driving mechanism. The two stages are synchronized so as to scan both the reticle and wafer. Reference numeral 33 denotes a focusing detection system used to measure a relative distance between the surface of a wafer to be scanned and the focusing surface thereof at a plurality of points on the wafer. Reference numeral 34 denotes a stage control system used to control both reticle stage 31 and wafer stage 32. The stage control system 34 also includes a synchronization controller. Reference numeral 35 denotes a synchronization error estimating device and reference numeral 36 denotes a scanning speed calculating device. A system controller 37, which includes both of the synchronous error estimation device 35 and the scan speed calculation device 36, sets a scanning speed and other exposure conditions and a console 38 functions as a user interface with the operator.

Hereunder, a description will be made of processings for deciding a scanning speed executed in the scanning exposure apparatus in this fourth embodiment with reference to the flowchart shown in FIG. 9. The controller 37 controls the processings executed in accordance with the flowchart shown in FIG. 9.

In steps S31 to S35, the controller 37, targeting one (sample shot) of the shots on the subject wafer, scans the sample shot while the focusing detection system 33 makes a focusing measurement for each sample shot at a plurality of points. At this time, the focusing system is not driven for adjusting focusing; the system makes only focusing measurements. Even in such a state, while the focusing system is not driven, a synchronization error appears between the wafer stage 2 and the reticle stage 1. This synchronization error seems to be caused by degradation of synchronization accuracy, equivalent to a so-called dark vibration level (constant vibration level in the servo locked state). Therefore, the synchronization accuracy affected by the synchronization error at that time, as well as the moving average and the moving standard deviation of the synchronization error are calculated beforehand.

Next, the processings in steps S31 to S35 will be described concretely. At first, the wafer stage 32 is driven so as to move the sample shot on the wafer to an exposure position in step S31. Then, the wafer stage 32 is synchronized with the reticle stage 31 so as to start scanning in step S32. In step S33, the focusing detection system 33 performs focusing measurement at a plurality of points in the sample shot. The synchronized scanning for the shot is completed in step S34. In step S35, it is decided whether or not the processings in steps S31 to S34 are completed for all the sample shots. When the decision is NO (there is still a non-processed sample shot), control goes back to step S31 so as to repeat the processings in steps S31 to S34 for the sample shot. When the decision is YES (when the process is completed for all sample shots), control goes to step S36.

In steps S36 to S38, the wafer surface shape in each sample shot is found according to the focusing measurement value obtained in steps S31 to S35 so as to create a stage driving track (typically, a driving track of the wafer stage 32) for adjustment of focusing/leveling. At this time, the wafer surface shape can also be found accurately by removing the differences in level from the already exposed resist with the use of the method disclosed in the official gazette of Japanese Patent Laid-Open No. 09-045608.

More concretely, in step S36, the wafer surface shape in the sample shot is calculated according to the focusing measurement values obtained in steps S31 to S35 at a plurality of points in the sample shot. In step S37, a stage driving track for adjustment of focusing/leveling at a sample shot exposure time is created in accordance with this surface shape from the wafer surface shape in the sample shot obtained in step S36. And, in step S38, it is decided whether or not the processings in steps S36 and S37 are completed for all the sample shots. When the decision is NO (there is still a non-processed sample shot), control goes back to step S36 so as to repeat the processings in steps S36 and S37 for the sample shot. When the decision is YES (when the process is completed for all sample shots), control goes to step S39.

In steps S39 to S41 and S43, the exposure apparatus estimates a relative positional error (that is, a synchronization error) between the reticle stage 31 and the wafer stage 32 when the stage driving track created in step S37 is used at each of a plurality of typical scanning speeds. Then, the exposure apparatus estimates the values of both moving average and moving standard deviation of the synchronization error.

Concretely, in step S39, the synchronization error estimating device 35 estimates a relative positional error (that is, a synchronization error) between the reticle stage 31 and the wafer stage 32 when the stage driving track created in step S37 is used. And, in step S40, the synchronization error estimating device 35 calculates both moving average and moving standard deviation of the synchronization error. In step S41, it is decided whether or not the processing steps S39 and S40 are completed for all the typical scanning speeds. When the decision is NO (there is still a non-processed scanning speed), control goes back to steps S39 and S40 for the scanning speed. When the decision is YES (when the process is completed for all of a plurality of typical scan speeds), control goes to step S42.

In step S42, the console 38 displays the results of the calculation in steps S39 to S41. Then, the operator selects a scanning speed matching with the subject process according to the scanning speed and an estimated value of the synchronization error at the scanning speed. The operator, after setting an exposure value, etc., according to the selected scanning speed, starts scanning exposure.

Figure 9:
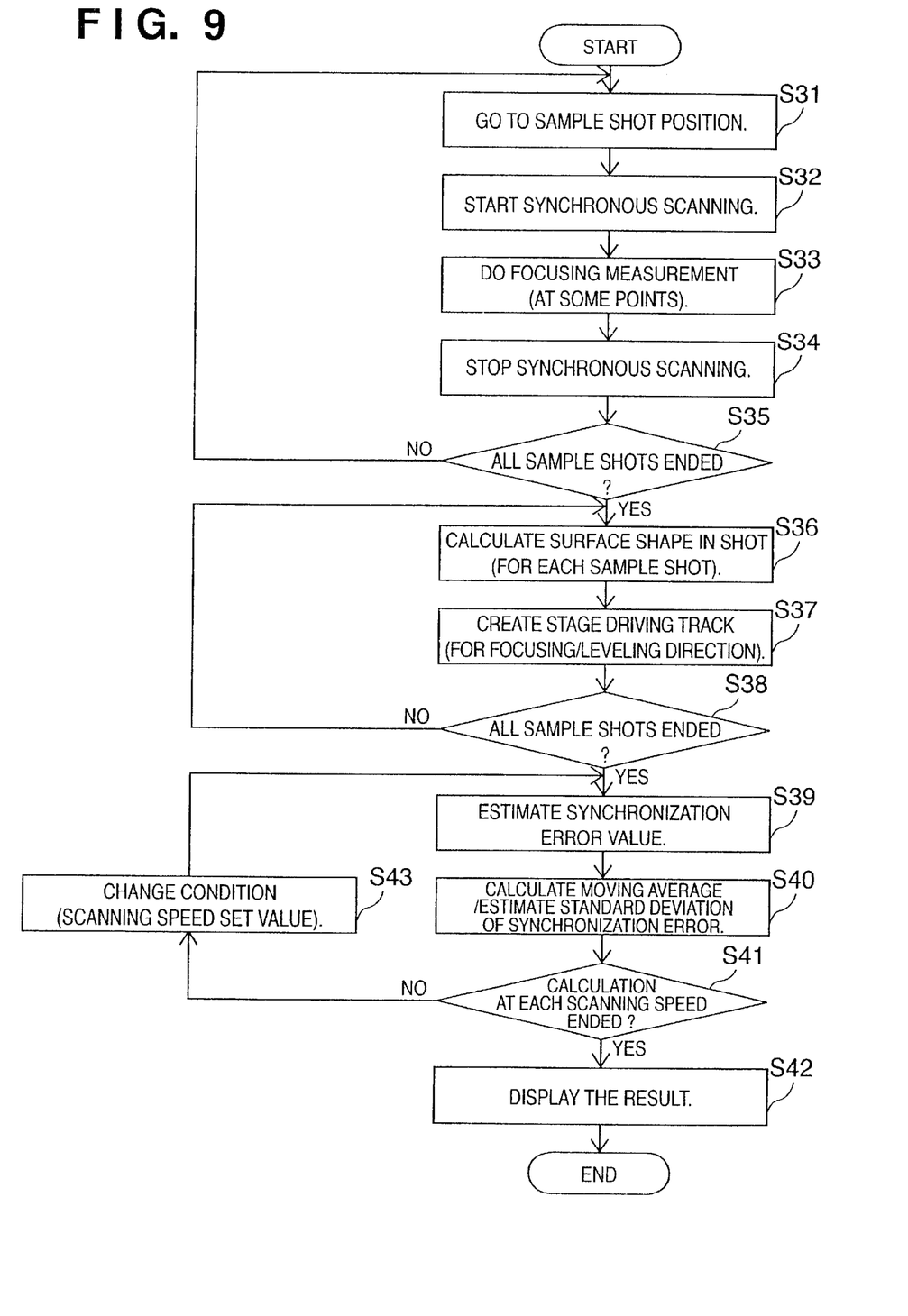
FIG. 9 is a flowchart showing the functions of the scanning exposure apparatus in the fourth embodiment and a scanning exposure method.

The operation shown in FIG. 9 may be done, for example, for each wafer, once for a plurality of wafers, or once for each lot.

In steps S39 to S41, just like the first embodiment described with reference to FIGS. 3 and 4, it is possible to represent an influence of a stage driven for tilting on the driving of the stage in the forward direction as a characteristic of transmission between an excitation input in the tilting direction and a control deviation in the forward direction, that is, the frequency characteristic G(s) shown in FIG. 3 so as to find the characteristic G(s) in advance, thereby an output, that is, a forward control deviation can be calculated accurately in the order of the block line diagram shown in FIG. 4 when the stage driving track (for adjustment of focusing/leveling) created in step S37 is entered to a system 10 having such a characteristic G(s).

As a result, it is possible to estimate a synchronization error for each scanning speed accurately. And, it is also possible to set items freely and precisely more, for example, to select a scanning speed in step S42 so as to reduce the synchronization error more at a narrow width line by giving consideration to the exposure conditions such as a beam width. Consequently, wafers can be exposed to light appropriately on the set process conditions.

As described above, according to the scanning exposure apparatus in this fourth embodiment, it is possible to set an optimal scanning speed as one of such manufacturing process conditions as wafer flatness, etc. Thereby, high yield exposure is enabled while both exposure performance and productivity are kept at a high level, respectively.

Furthermore, just like the first embodiment described with reference to FIGS. 6 and 7, when the projection exposure apparatus shown in FIG. 8 is used for manufacturing semiconductor devices, the effects of the projection exposure apparatus are combined with those of the scanning exposure apparatus. Thereby, highly integrated semiconductor devices can be manufactured surely at a high yield while such manufacturing has been difficult conventionally.

Fifth Embodiment

Next, the fifth embodiment of the present invention will be described. In this fifth embodiment, setting of the scanning speed by the operator in step S42 (exposure method) in the fourth embodiment is replaced with automatic setting of the scanning speed. In order to achieve this, it is just required to configure this system controller 37 shown in FIG. 8 so that target synchronization accuracy is preset as a threshold value required for each exposure lot and the synchronization accuracy is estimated as described in the fourth embodiment, then the maximum scanning speed that satisfies the set synchronization accuracy threshold is selected automatically. Then, in addition to the advantages of the fourth embodiment, it is possible to obtain another advantage that the maximum productivity can be obtained efficiently while the exposure performance is kept as is.

Furthermore, the present invention includes program codes themselves for driving various devices so as to execute the functions of the scanning exposure apparatus described in the above respective embodiments, as well as means for supplying those program codes to a computer, the program codes themselves for executing the processings in steps for deciding a scanning speed (for example, steps S1 to S12 shown in FIG. 2 and steps S31 to S43 shown in FIG. 9) and means for supplying those program codes to a computer, for example, a recording medium for storing those program codes.

In such a case, a predetermined writing/reading apparatus reads the program codes from the recording medium, so that an EEPROM operates according to the program codes. The recording medium for recording those program codes may be any of floppy disks, hard disks, optical disks, optical magnetic disks, CD-ROMs, magnetic tapes, non-volatile memory cards, ROMs, etc.

Furthermore, the present invention also includes program codes supplied as described above and executed by a computer so as to execute the functions of the scanning exposure apparatus in this fifth embodiment, as well as the program codes used in cooperation with an OS (Operating System) or another application program running in the computer so as to execute the functions of the scanning exposure apparatus in the fifth embodiment.

Furthermore, the present invention also includes a system that enables the CPU, etc., of a capability expansion board and a capability expansion unit to execute part or the whole of actual processings according the program codes stored in a memory of the capability expansion board of a computer and/or a capability expansion unit connected to a computer. Thereby, the functions of the scanning exposure apparatus in this embodiment can be executed.

According to the present invention, for example, an optimal scanning speed can be set as one of such manufacturing process conditions as wafer flatness. Thereby, high yield exposure is enabled while both exposure performance and productivity are kept at a high level, respectively.

Furthermore, according to the present invention, because an optimal scanning speed is set for each of a plurality of areas on the subject wafer (for example, in a shot), thereby, the processing capability, that is, the throughput of the exposure apparatus is prevented from going low and high yield exposure is enabled while both focusing performance and productivity are improved.

As many apparently widely different embodiments of the present invention can be made without departing from the spirit and scope thereof, it is to be understood that the invention is not limited to the specific embodiments thereof except as defined in the claims.

What is claimed is:

1. A scan exposure apparatus comprising:
   a mask stage on which a mask is to be placed;
   a substrate stage on which a substrate is to be placed;
   a detection unit for detecting a surface shape of the substrate in each of a plurality of areas thereof, the surface shape being taken into consideration to drive said substrate stage in an exposure process; and
   a controller for deciding scanning speeds of said mask stage and said substrate stage for each of a plurality of the areas based on the result of detection by said detection unit so as not to exceed a predetermined value of a synchronization error between said mask stage and said substrate stage.

2. The exposure apparatus according to claim 1, said controller including:
   (i) a track creating device for creating a driving track of said substrate stage, which is used to drive said substrate stage in the exposure process, based on the result of a detection by said detection unit; and
   (ii) an estimating device for estimating a synchronization error between said mask stage and said substrate stage when the substrate is driven along the driving track created by said track creating device,
      wherein said controller decides scanning speeds of said mask stage and said substrate stage for each of a plurality of the areas so as not to exceed the predetermined value of the synchronization error estimated by said estimating device.

3. The exposure apparatus according to claim 1,
   wherein said detection unit detects a position of the surface of the substrate in the vertical direction in each of a plurality of the areas.

4. The exposure apparatus according to claim 1,
wherein said detection unit detects a distance between the surface of the substrate and the focusing surface of a projection optical system for projecting a pattern of the reticle in each of a plurality of the areas.

5. The exposure apparatus according to claim 1,
wherein each of a plurality of the areas respectively corresponds to one of a plurality of shot areas on the substrate and said controller decides scanning speeds of said mask stage and said substrate stage for each of the areas.

6. The exposure apparatus according to claim 1, further comprising a measuring instrument for measuring a synchronization error between said substrate stage and said mask stage when the exposure process is executed; and
said controller includes a changing device for changing the scanning speeds of said mask stage and said substrate stage decided for each of a plurality of the areas based on the result of measurement by said measuring instrument.

7. The exposure apparatus according to claim 1,
wherein said detection unit detects a surface shape of each area on the substrate while both of said mask stage and said substrate stage are driven for scanning.

8. The exposure apparatus according to claim 1,
wherein a detection by said detection unit is performed before an actual exposure operation.

9. A controlling method for controlling an exposure apparatus provided with a mask stage on which a mask is to be placed and a substrate stage on which a substrate is to be placed and enabled to expose the substrate to light with use of a pattern of the mask while both of the mask stage and the substrate are synchronously scanned, said method comprising:
a detecting process of detecting a surface shape in each of a plurality of areas on the substrate, the surface shape being taken into consideration to drive the substrate stage in an exposure process; and
a scanning speed deciding process of deciding scanning speeds of the mask stage and the substrate stage for each of a plurality of the areas based on the result of a detection in said detecting process step so as not to exceed a predetermined value of the synchronization error between the mask stage and the substrate stage.

10. The controlling method according to claim 9, further comprising a track creating process of creating a driving track of the substrate stage, which is used to drive the substrate stage in the exposure process, based on the result of the detection in said detecting process step,
wherein said scanning speed deciding process includes an estimating process of estimating a synchronization error between the mask stage and the substrate stage when the substrate stage is driven along the driving track created by the track creating process and decides scanning speeds of the mask stage and the substrate stage for each of a plurality of the areas so as not to exceed the predetermined value of the synchronization error estimated in said estimating process.

11. The controlling method according to claim 9,
wherein said detecting process detects a position of the surface of the substrate in the vertical direction in each of a plurality of the areas.

12. The controlling method according to claim 9,
wherein said detecting process detects a distance between the surface of the substrate in each of a plurality of the areas and the focusing surface of a projection optical system for projecting a pattern of the reticle.

13. The controlling method according to claim 9,
wherein each of a plurality of the areas respectively corresponds to one of a plurality of shot areas on the substrate respectively and said scanning speed deciding process decides scanning speeds of the mask stage and the substrate stage for each of a plurality of the shot areas.

14. The controlling method according to claim 9, further comprising a measuring process of measuring a synchronization error between the mask stage and the substrate stage when the exposure process is executed,
wherein said scanning speed deciding process includes a changing process of changing the scanning speeds of the mask stage and the substrate stage decided for each of a plurality of the areas based on the result of the measurement in said measuring process.

15. The controlling method according to claim 9,
wherein said detecting process detects a surface shape of each of a plurality of the areas on the substrate while both of the mask stage and the substrate stage are driven for scanning.

16. The controlling method according to claim 9,
wherein said detecting process is performed before an actual exposure operation.

17. A controlling program for controlling an exposure apparatus provided with a mask stage on which a mask is to be placed and a substrate stage on which a substrate is to be placed and enabled to expose the substrate to light with use of a pattern of the mask while both of the mask stage and the substrate stage are synchronously scanned, said program comprising:
a detecting process of detecting a surface shape of each of a plurality of areas on the substrate, the surface shape being taken into consideration to drive the substrate stage in an exposure process; and
a scanning speed deciding process of deciding scanning speeds of the mask stage and the substrate stage for each of a plurality of the areas based on the result of a detection in said detecting process so as not to exceed a predetermined value of a synchronization error between the mask stage and the substrate stage.

18. An exposure method that uses an exposure apparatus provided with a mask stage on which a mask is to be placed and a substrate stage on which a substrate is to be placed and enabled to expose the substrate to light with use of a pattern of the mask while both the mask stage and the substrate stage are synchronously scanned, said method comprising:
a detecting process of detecting a surface shape of each of a plurality of areas on the substrate;
a scanning speed deciding process of deciding scanning speeds of the mask stage and the substrate stage for each of a plurality of the areas based on the result of the detection in said detecting process so as not to exceed a predetermined value of a synchronization error between the mask stage and the substrate stage; and
an exposing process of exposing the substrate to light with use of a pattern of the mask by controlling both of the mask stage and the substrate stage according to the scanning speed decided in said scanning speed deciding process.

19. A manufacturing method for manufacturing semiconductor devices, said method comprising:
a process of coating a sensitive material on a substrate;
a process of exposing the sensitive material on the substrate to light with use of said exposure method according to claim 18; and
a process of developing the sensitive material after said exposing process.

* * * * *